(12) United States Patent
Chuang et al.

(10) Patent No.: US 9,478,469 B2
(45) Date of Patent: Oct. 25, 2016

(54) INTEGRATED CIRCUIT COMPRISING BUFFER CHAIN

(71) Applicant: Taiwan Semiconductor Manufacturing Company Limited, Hsin-Chu (TW)

(72) Inventors: Yi-Lin Chuang, Taipei (TW); Chien-Hui Chen, Jhu-Dong Township (TW); Wei-Pin Changchien, Taichung (TW); Chin-Her Chien, Chung-Li (TW); Nan-Hsin Tseng, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 67 days.

(21) Appl. No.: 14/658,446

(22) Filed: Mar. 16, 2015

(65) Prior Publication Data
US 2015/0187666 A1 Jul. 2, 2015

Related U.S. Application Data

(62) Division of application No. 14/063,007, filed on Oct. 25, 2013, now Pat. No. 8,981,842.

(51) Int. Cl.
*G11C 29/02* (2006.01)
*H01L 21/66* (2006.01)
*G06F 17/50* (2006.01)

(52) U.S. Cl.
CPC .......... *H01L 22/20* (2013.01); *G06F 17/5081* (2013.01); *G11C 29/022* (2013.01); *H01L 22/14* (2013.01); *H01L 22/34* (2013.01)

(58) Field of Classification Search
CPC .................. G11C 29/02; G11C 29/025
See application file for complete search history.

(56) References Cited

U.S. PATENT DOCUMENTS

| | | | |
|---|---|---|---|
| 8,124,448 B2 * | 2/2012 | Hudson | H01L 23/562 257/E21.499 |
| 8,350,357 B2 * | 1/2013 | Furumiya | H01F 19/00 257/531 |
| 8,458,900 B2 * | 6/2013 | Kodani | H01L 21/4853 29/832 |
| 8,516,316 B2 | 8/2013 | Lam et al. | |

* cited by examiner

*Primary Examiner* — Jeffrey Zweizig
(74) *Attorney, Agent, or Firm* — Cooper Legal Group, LLC

(57) ABSTRACT

Among other things, an integrated circuit and method for routing electrical pathways of an integrated circuit is provided. The integrated circuit comprises a buffer chain coupling a first cell of the integrated circuit to a second cell of the integrated circuit. An electrical pathway coupling a first inverter of the buffer chain with a second inverter of the buffer chain extends through a first set of metal layers and is routed to form a pulse-like shape having an apex at a top layer of the first set.

20 Claims, 7 Drawing Sheets

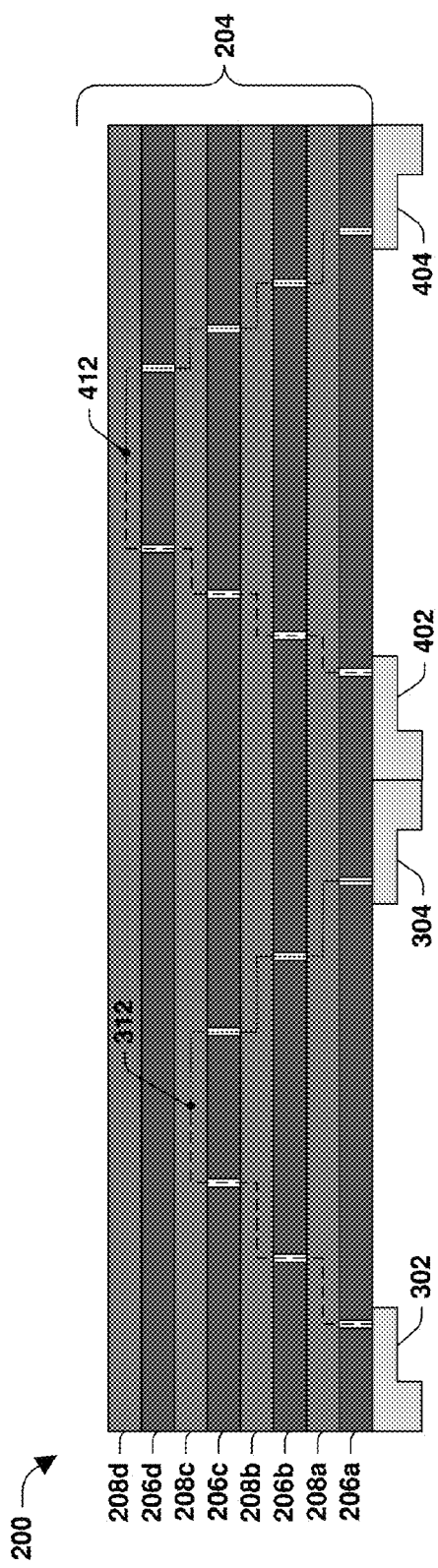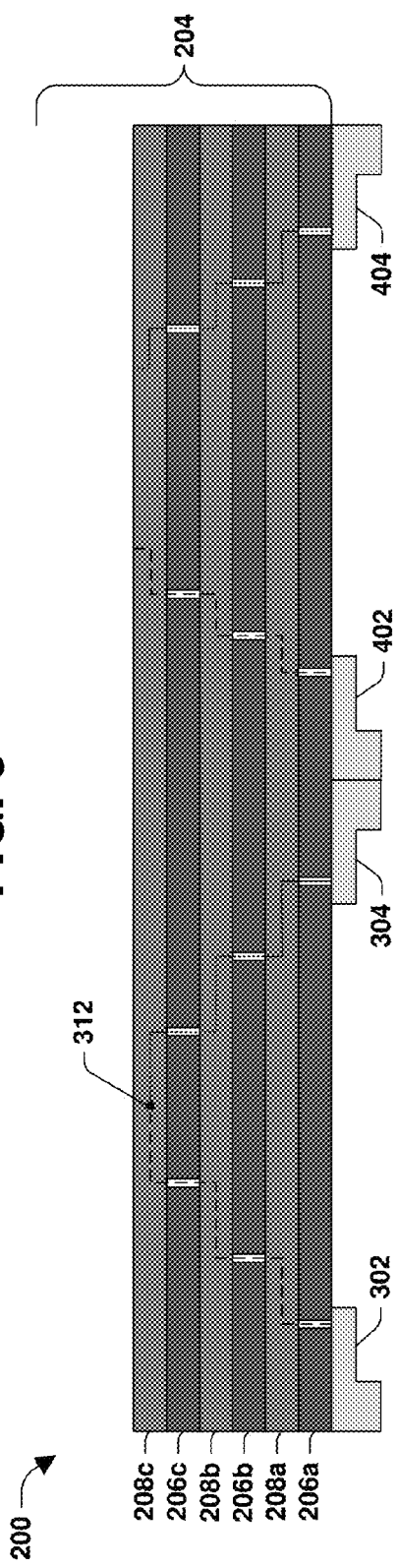

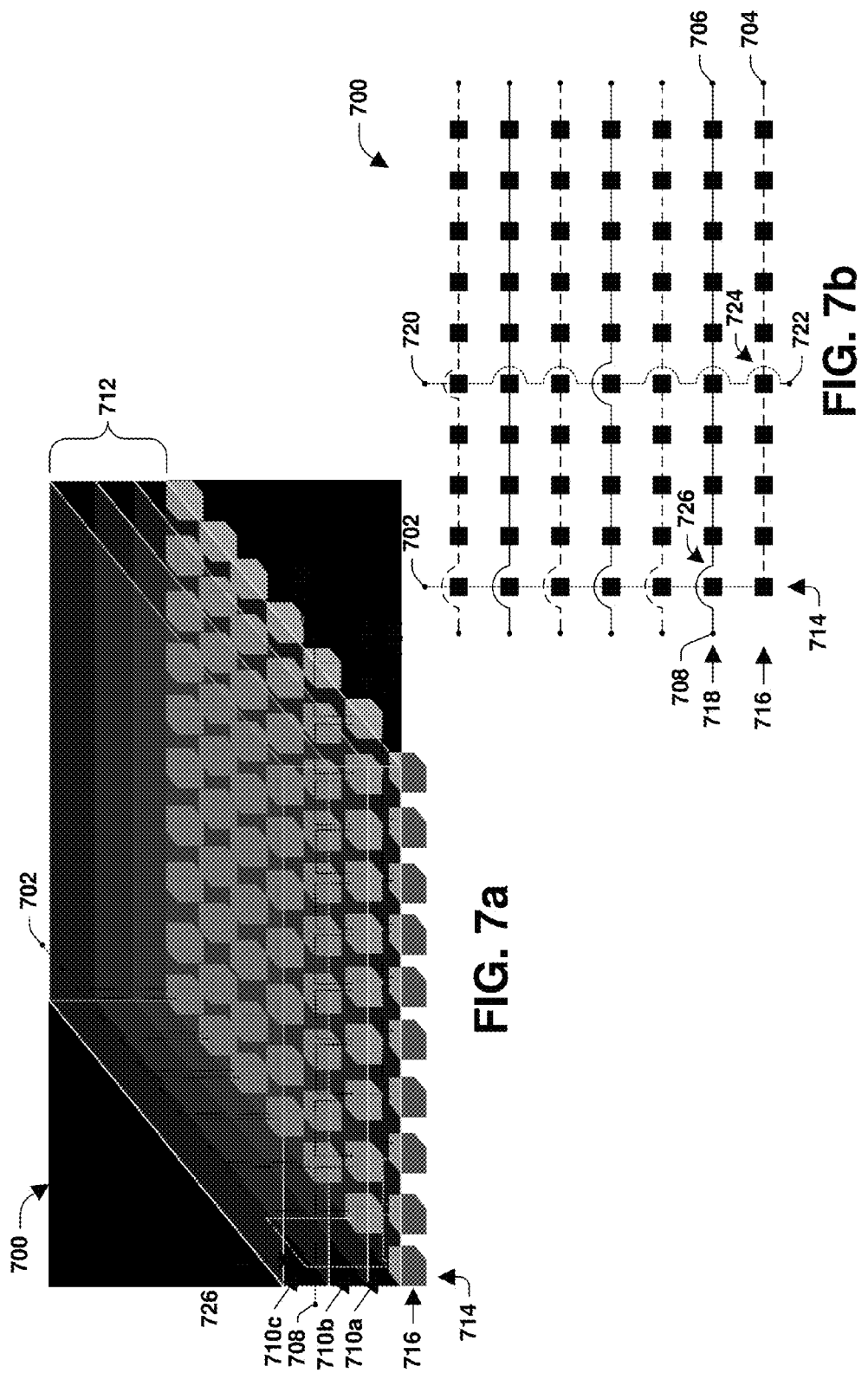

INTEGRATED CIRCUIT COMPRISING BUFFER CHAIN

RELATED APPLICATIONS

This application claims priority to U.S. patent application Ser. No. 14/063,007, titled "INTEGRATED CIRCUIT COMPRISING BUFFER CHAIN" and filed on Oct. 25, 2013, which is incorporated herein by reference.

BACKGROUND

A buffer chain typically includes two or more inverters arranged in series and is often used in integrated circuits (ICs) to drive a signal between two cells or to introduce a delay into the signal. The number of inverters within a buffer chain is typically a function of a desired driving ability or a desired delay.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

According to some embodiments, an integrated circuit comprising a buffer chain is provided. The buffer chain comprises at least two inverters that are coupled via an electrical pathway. The electrical pathway is formed by a first conductive path that is coupled to a first inverter of the at least two inverters and a second conductive path that is coupled to a second inverter of the at least two inverters. The first conductive path and the second conductive path respectively extend through a first set of metal layers of a routing substrate and are coupled together at a top metal layer of the first set, where the top metal layer is a metal layer of the first set that is most distal from the first inverter or the second inverter. Accordingly, in some embodiments, the electrical pathway has a pulse-like shape, where an apex of the electrical pathway is situated at the top metal layer of the first set. It is to be appreciated that the top metal layer of the first set is not necessarily the top metal layer of the routing substrate, but rather merely a most distal metal layer through which the first conductive path and the second conductive path extend relative to the first inverter of the second inverter.

According to some embodiments, the integrated circuit comprises a plurality of buffer chains, and apexes of the electrical pathways between various inverters of the plurality of buffer chains are situated at different metal layers. By way of example, a first electrical pathway between a first inverter and a second inverter of a first buffer chain has an apex situated at a first metal layer and a second electrical pathway between a third inverter and a fourth inverter, of the first buffer chain or a second buffer chain, has an apex situated at a second metal layer. In some embodiments, the electrical pathways of a first buffer chain respectively have an apex situated at a same metal layer. For example, the electrical pathways between respective inverters of a first buffer chain have an apex located at a first metal layer of the routing substrate and electrical pathways between respective inverters of the second buffer chain have an apex located at a second metal layer of the routing substrate, for example.

According to some embodiments, the pulse-like shape of respective electrical paths is configured to facilitate identification of defects within a buffer chain using an electron beam prober or other analysis component. By way of example, if a fault is identified during testing of an integrated circuit, a first metal layer of the routing substrate is exposed to reveal apexes of electrical pathways between a first set of inverters, such as comprised within a first set of buffer chains. The electron beam prober then images the first metal layer to identify defects or shorts in electrical pathways having an apex at the first metal layer. Next, the first metal layer of the routing substrate is removed to expose a second metal layer of the routing substrate and reveal apexes of electrical pathways between a second set of inverters. The electron beam prober then images the second metal layer to identify defects or shorts in electrical pathways having an apex at the second metal layer. Such a process is repeated until a stopping criterion is satisfied.

The following description and annexed drawings set forth certain illustrative aspects and implementations. These are indicative of but a few of the various ways in which one or more aspects are employed. Other aspects, advantages, and novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and structures of the drawings are not necessarily be drawn to scale. Accordingly, the dimensions of the various features is arbitrarily increased or reduced for clarity of discussion.

FIG. 5 illustrates a cross-sectional view of a semiconductor element according to some embodiments.

FIG. 6 illustrates a cross-sectional view of a semiconductor element according to some embodiments.

FIG. 7a illustrates a perspective view of a semiconductor element according to some embodiments.

FIG. 7b illustrates a top-down view of a semiconductor element according to some embodiments.

DETAILED DESCRIPTION

Figure 1:
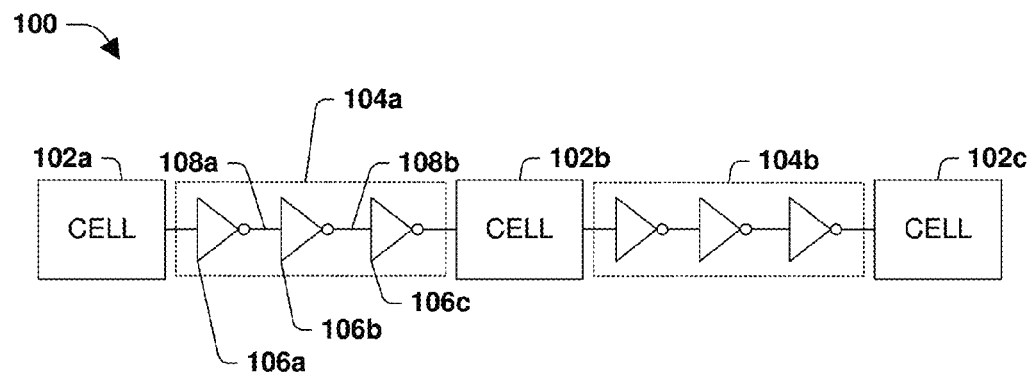
FIG. 1 illustrates a diagram of an integrated circuit according to some embodiments.

Embodiments or examples, illustrated in the drawings are disclosed below using specific language. It will nevertheless be understood that the embodiments or examples are not intended to be limiting. Any alterations and modifications in the disclosed embodiments or examples, and any further applications of the principles disclosed in this document are contemplated as would normally occur to one of ordinary skill in the pertinent art.

Referring to FIG. 1, a component block diagram of a portion of an integrated circuit 100 according to some embodiments is provided. The integrated circuit 100 comprises a plurality of cells 102, such as memory cells, and a plurality of buffer chains 104. A first cell 102a is coupled to a second cell 102b via a first buffer chain 104a and the second cell 102b is coupled to a third cell 102c via a second buffer chain 104b. Respective buffer chains comprise a plurality of inverters 106.

In some embodiments, respective buffer chains 104 are configured to drive a signal between two cells 102. By way of example, the first buffer chain 104a is configured to drive a signal between the first cell 102a and the second cell 102b by altering a transition time of a voltage signal between a LOW voltage state and a HIGH voltage stage. In some embodiments, respective buffer chains 104 are configured to delay a signal between two cells 102. By way of example, the first buffer chain 104a is configured to delay application of a voltage signal, emitted by the first cell 102a, to the second cell 102b. The number of inverters 106 that a buffer chain 104 comprises is a function the desired drive capability of the buffer chain 104 or the desired delay capability of the buffer chain 104, for example.

In some embodiments, the inverters 106 are arranged in series. For example, a first inverter 106a of a first buffer chain 104a is coupled to a second inverter 106b of the first buffer chain 104a via a first electrical pathway 108a and the second inverter 106b is coupled to a third inverter 106c of the first buffer chain 104a via a second electrical pathway 108b.

Figure 2:
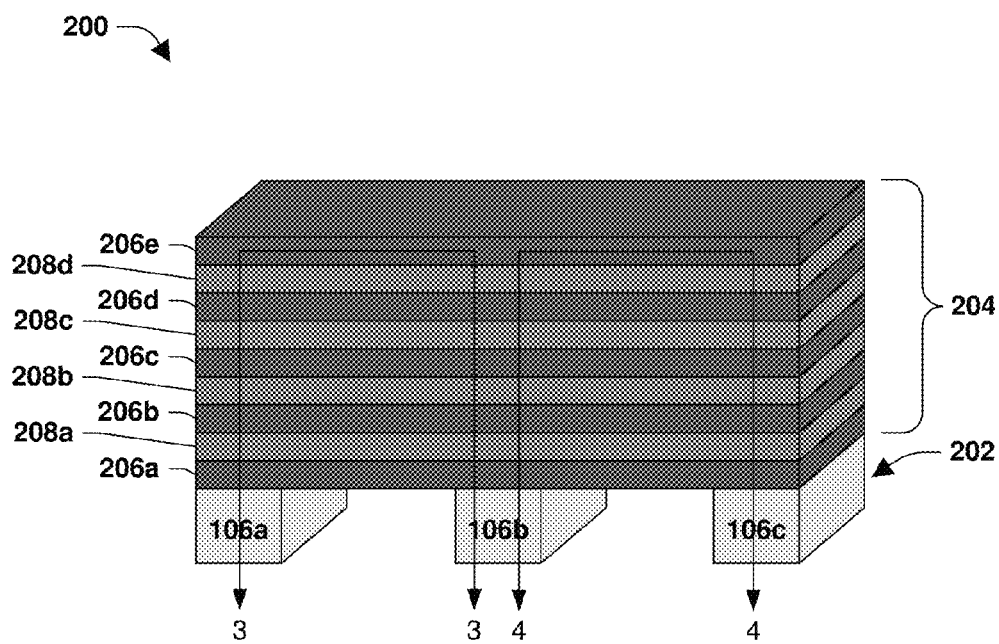
FIG. 2 illustrates a perspective view of a semiconductor element according to some embodiments.

Referring to FIG. 2, a perspective via of a semiconductor element 200 forming a buffer chain, such as comprised within an integrated circuit, according to some embodiments is provided. Inverters 106 are situated within a first physical layer 202 of the semiconductor element 200 and electrical pathways between inverters 106 are situated within a routing substrate 204 semiconductor element 200. The routing substrate 204 comprises one or more insulator layers 206 and one or more metal layers 208. In some embodiments, the respective metal layers 208 are situated between two insulator layers 206. For example, a first metal layer 208a is situated between a first insulator layer 206a and a second insulator layer 206b.

As will be further described in more detail below, at least some of the insulator layers 206 respectively comprise an insulating material that is substantially non-conductive and one or more electrically conductive vias, such as copper pillars, for example, that extend through the insulating material. For example, the first insulator layer 206a comprises at least one via extending from the first inverter 106a to the first metal layer 208a. As another example, the second insulator layer 206b comprises at least one via extending from the first metal layer 208a to the second metal layer 208b.

An electrical pathway between two inverters 106 extends through a first set of one or more metal layers 208 and a first set of one or more insulator layers 206 of the routing substrate 204. For example, a first electrical pathway between a first inverter 106a of a buffer chain and a second inverter 106b of the buffer chain extends through a first insulator layer 206a, a first metal layer 208a, a second insulator layer 206b, a second metal layer 208b, a third insulator layer 206c, and a third metal layer 208c. In some embodiments, a second electrical pathway between the second inverter 106b and the third inverter 106c extends through the same set of metal layers 208 or the same set of insulator layers 206 as the first electrical pathway. In other embodiments, the second electrical pathway extends through a different set of metal layers 208 or a different set of insulator layers 206. For example, the second electrical pathway additionally extends through a fourth insulator layer 206d and a fourth metal layer 208d.

Figure 3:
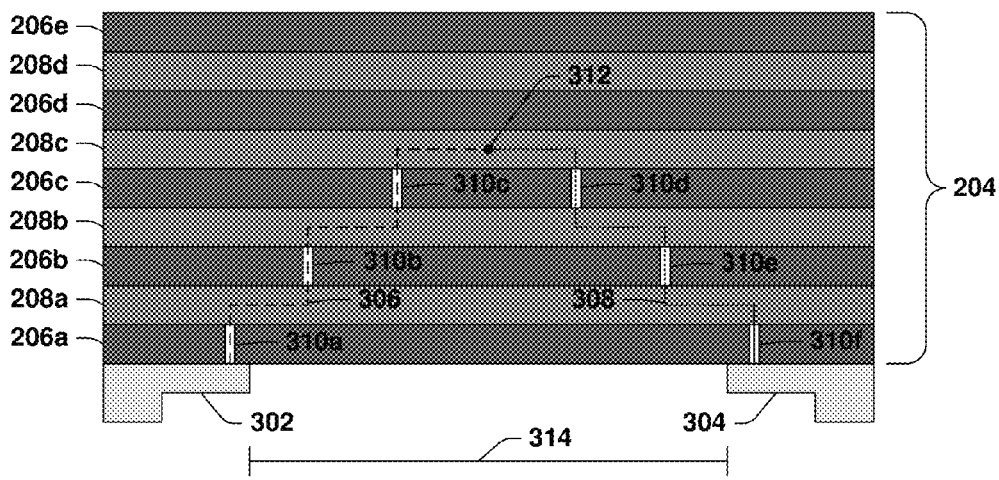
FIG. 3 illustrates a cross-sectional view of a semiconductor element according to some embodiments.

Referring to FIG. 3, a cross-sectional view taken alone line 3-3 of the semiconductor element 200 is provided. The cross-sectional view illustrates a routing pattern of a first electrical pathway between a polysilicon portion 302 of the first inverter 106a and a gate portion 304 of the second inverter 106b.

The first electrical pathway is formed by a first conductive path 306, represented by the dashed line, and a second conductive path 308, represented by the dotted line. The first conductive path 306 is coupled to the second conductive path 308 at a connection point 312, causing the first electrical pathway to have a pulse-like shape with an apex at the third metal layer 208c of the routing substrate 204. The first conductive path 306 is coupled to the first inverter 106a or rather the polysilicon portion 302 of the first inverter 106a, and the second conductive path 308 is coupled to the second inverter 106b or rather the gate portion 304 of the second inverter 106b.

The first conductive path 306 and the second conductive path 308 respectively extend through a first set of metal layers 208a-c and a first set insulator layers 206a-c of the routing substrate 204. For example, the first conductive path 306 is formed by a first via 310a of the first insulator layer 206a, a first conductive trace of the first metal layer 208a, a second via 310b of the second insulator layer 206b, a second conductive trace of the second metal layer 208b, a third via 310c of the third insulator layer 206c, and a third conductive trace of the third metal layer 208c. As another example, the second conductive path 308 is formed by a fourth conductive trace of the third metal layer 208c, a fourth via 310d of the third insulator layer 206c, a fifth conductive trace of the second metal layer 208b, a fifth via 310e of the second insulator layer 206b, a sixth conductive trace of the first metal layer 208a, and a sixth via 310f of the first insulator layer 206a.

The third conductive trace is coupled to the fourth conductive trace of the third metal layer 208c at the connection point 312. The connection point 312 is situated at a top metal layer of the first set of metal layers 208a-c through which the first conductive path 306 and the second conductive path 308 extend. That is, stated differently, the connection point 312 is situated at the most distal metal layer of the routing substrate 204 that the first conductive path 306 and the second conductive path 308 extend through relative to the polysilicon portion 302 or the gate portion 304. In this way, the first electrical pathway forms a substantially pulse-like shape having an apex at the top metal layer of the first set of metal layers 208a-c, for example. In some embodiments, the first conductive path 306 and the second conductive path 308 are not coupled at other metal layers of the first set of metal layers 208a-c besides the top metal layer of the first set. Thus, in such embodiments, the first conductive path 306 is electrically isolated from the second conductive path 308 at metal layers of the first set other than the top metal layer of the first set.

It is to be appreciated that as used herein, a conductive trace refers to an electrically conductive channel formed within a metal layer. In some embodiments, such an electrically conductive channel is formed by a deposition and etching process. In other embodiments, such an electrically conductive channel is formed by inserting a wire within a compound or material. In still other embodiments, other techniques for forming such an electrically conductive channel are contemplated.

Figure 4:
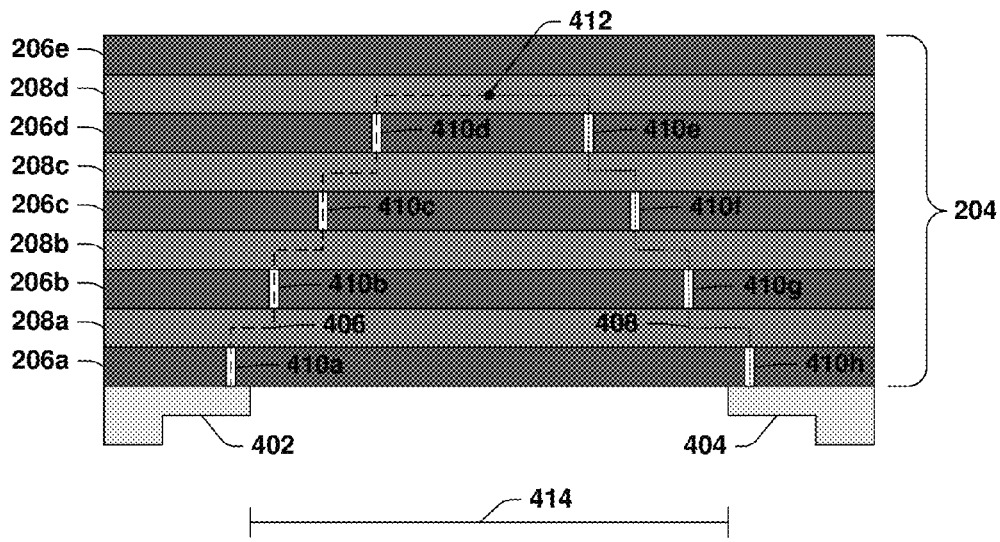
FIG. 4 illustrates a cross-sectional view of a semiconductor element according to some embodiments.

Referring to FIG. 4, a cross-sectional view 400 taken alone line 4-4 of the semiconductor element 200 is provided. The cross-sectional view 400 illustrates a routing pattern of the second electrical pathway between a polysilicon portion 402 of the second inverter 106b and a gate portion 404 of the third inverter 106c.

The second electrical pathway is formed by a third conductive path 406, represented by the dashed line, and a fourth conductive path 408, represented by the dotted line. The third conductive path 406 is coupled to the fourth conductive path 408 at a second connection point 412, causing the second electrical pathway to have a pulse-like shape with an apex at the fourth metal layer 208d of the routing substrate 204. The third conductive path 406 is coupled to the second inverter 106b or rather the polysilicon portion 402 of the second inverter 106b, and the fourth conductive path 408 is coupled to the third inverter 106c or rather the gate portion 404 of the third inverter 106c.

The third conductive path 406 and the fourth conductive path 408 respectively extend through a second set of metal layers 208a-d and a second set insulator layers 206a-d. For example, the third conductive path 406 is formed by a seventh via 410a of the first insulator layer 206a, a seventh conductive trace of the first metal layer 208a, an eighth via 410b of the second insulator layer 206b, an eighth conductive trace of the second metal layer 208b, a ninth via 410c of the third insulator layer 206c, a ninth conductive trace of the third metal layer 208c, a tenth via 410d of the fourth insulator layer 206d, and a tenth conductive trace of the fourth metal layer 208d. As another example, the fourth conductive path 408 is formed by an eleventh conductive trace of the fourth metal layer 208d, an eleventh via 410e of the fourth insulator layer 206d, a twelfth conductive trace of the third metal layer 208c, a twelfth via 410f of the third insulator layer 206c, a thirteenth conductive trace of the second metal layer 208b, a thirteenth via 410g of the second insulator layer 206b, a fourteenth conductive trace of the first metal layer 208a, and a fourteenth via 410h of the first insulator layer 206a.

The tenth conductive trace is coupled to the eleventh conductive trace of the fourth metal layer 208d at the second connection point 412. The second connection point 412 is situated at a top metal layer of the second set of metal layers 208a-d through which the third conductive path 406 and the fourth conductive path 408 extend. That is, stated differently, the second connection point 412 is situated at the most distal metal layer of the routing substrate 204 that the third conductive path 406 and the fourth conductive path 408 extend through relative to the polysilicon portion 402 or the gate portion 404. In this way, the second electrical pathway forms a substantially pulse-like shape having an apex at the top metal layer of the second set of metal layers 208a-d, for example. In some embodiments, the third conductive path 406 and the fourth conductive path 408 are not coupled at other metal layers of the second set of metal layers 208a-d besides the top metal layer of the second set.

In some embodiments, a distance between two inverters is a function of a number of metal layers through which an electrical pathway coupling the two inverters extends. By way of example, the first inverter 106a is spaced a first distance 314 from the second inverter 106b, and the second inverter 106b is spaced a second distance 414 from the third inverter 106c. In some embodiments, the second distance 414 is greater than the first distance 314 because the second electrical pathway extends through a four metal layers 208a-d whereas the second electrical pathway extends through merely three metal layers 208a-c. In other embodiments, the second distance 414 is less than or equal to the second distance.

While FIGS. 3-4 illustrate two electrical pathways of a same buffer chain extending through different sets of metal layers and having apexes at different metal layers, in other embodiments, the electrical pathways of a buffer chain respectively extend through a same set of metal layers. By way of example, the first electrical pathway and the second electrical pathway of the first buffer chain respective extend merely through three metal layers 208a-c. Thus, the connection points 310, 412, or apexes, of the first electrical pathway and the second electrical pathway are situated on a same, third metal layer 208c, for example.

The pulse-like shape of respective electrical pathways is configured to, among other things, facilitate defect identification if a fault occurs within an integrated circuit or within a buffer chain of the integrated circuit. By way of example, upon completion of the integrated circuit, integrated circuit testers apply manufacturing tests to validate that the integrated circuit hardware contains no defects that inhibit the integrated circuit from functioning as intended. If the integrated circuit fails one or more of the tests, it is desirable to determine the location of a defect that contributed to the fault. If the defect is found to be within the buffer chain, it is desirable to identify the location of the defect within the buffer chain, for example. Accordingly, as illustrated in FIG. 5, a first portion of the routing substrate 204, such as fifth isolation layer 206e, is removed from the semiconductor element 200 to expose the connection points of one or more electrical pathways, such as the second connection point 412 of the second electrical pathway. Electron beams are applied to the exposed connection points, including the second connection point 412, and an electron beam prober measures waveforms through the one or more electrical pathways having the exposed connection points, for example. In some embodiments, an image is formed based upon measurements yielded from the electron beam prober, where good connections are represented in the image by a first color, such as white, and defective connections, such as short-circuits, are represented in the image by a second color, such as black.

Next, as illustrated in FIG. 6, a second portion of the routing substrate 204, such as the fourth metal layer 208d and the fourth insulator layer 206d, is removed from the semiconductor element 200 to expose connection points of one or more other electrical pathways, such as the connection point 312 of the first electrical pathway. Electron beams are again applied to the exposed connection points, including the first connection point 312, and the electron beam prober measures waveforms through the one or more other electrical pathways having the exposed connection points to identify possible defects within the one or more other electrical pathways, for example.

In some embodiments, such a process of removing a portion of the routing substrate 204 and exposing connection points is repeated until specified stopping criteria is satisfied. By way of example, the process is repeated until the connection points of respective electrical pathways within one or more buffers chains of the integrated circuit have been exposed. As another example, the process is repeated until a defect is identified in one or more of the electrical pathways.

In some embodiments, one or more buffer chains are arranged in a mesh-like layout, where a first set of electrical pathways have connection points, or apexes, at a first metal layer and a second set of electrical pathways have a connection points, or apexes, at a second metal layer. In some embodiments, at least some of the first set of electrical pathways overlaps at least some of the second set of electrical pathways. By way of example, a first electrical pathway of a first buffer chain has a connection point at a first metal layer, which is overlapped by a first electrical pathway of a second buffer chain having a connection point at a second metal layer.

Referring to FIGS. 7a-b, an example mesh-like layout of one or more buffer chains according to some embodiments is provided. More particularly, FIG. 7a illustrates a perspective view of a semiconductor element 700 forming a plurality of buffer chains and FIG. 7b illustrates a top-down view of the semiconductor element 700. A first terminal 702 of a first buffer chain is configured to be coupled to a first cell of an integrated circuit and a second terminal 704 of the first buffer chain is configured to be coupled to a second cell of the integrated circuit. A third terminal 706 of a second buffer chain is configured to be coupled to a third cell of the integrated circuit and a fourth terminal 708 is configured to be coupled to a fourth cell of the integrated circuit. Additional buffer chains coupling other cells together are further represented in FIG. 7b.

To describe an elevation of the connection points, or apexes, of respective electrical pathways, lines in FIG. 7B have been patterned according to an elevation of the connection point. For example, electrical pathways having a connection point or apex at a first metal layer 710a of a routing substrate 712 are represented by a dashed line, and electrical pathways having a connection point or apex at a second metal layer 710b of the routing substrate 712 are represented by a solid line. Electrical pathways having a connection point or apex at a third metal layer 208c of the routing substrate 712 are represented by a dotted line.

The first buffer chain comprises a first column 714 of inverters, a first row 716 of inverters, and a first set of electrical pathways coupling the inverters of the first buffer chain together in series. The inverters are represented by the dark grey cubes in FIG. 7a and the black squares in FIG. 7b. The apex of respective electrical pathways for a first portion of the first buffer chain, coupling the first column 714 of inverters in series, is situated within a third metal layer 710c of the routing substrate 712. The apex of respective electrical pathways for a second portion of the first buffer chain, coupling the first column 714 of inverters in series, is situated within a first metal layer 710a of the routing substrate 712.

The second buffer chain comprises at least some inverters situated within a second row 718, and not also situated within the first column 714. The apex of respective electrical pathways of the second buffer chain is situated within a second metal layer 710b of the routing substrate 712.

In some embodiments, at least some of the electrical pathways of a buffer chain are situated within the layers to cause overlap with one or more electrical pathways of another buffer chain. By way of example, with reference to FIG. 7b, at least some electrical pathways of a third buffer chain, extending from a fifth terminal 720 to a sixth terminal 722 overlap electrical pathways of one or more other buffer chains. By way of example, an electrical pathway of the third buffer chain, having an apex in the third metal layer 710c, overlaps an electrical pathway of the first buffer chain, having an apex in the first metal layer 710a, at an overlap region 724. As another example, an electrical pathway of the second buffer chain overlaps the electrical pathway of the first buffer chain at a second overlap region 726, where the overlap is represented in FIG. 7A with the electrical pathway of the second buffer chain passing underneath the electrical pathway of the first buffer chain at the overlap region 726.

Figure 8:
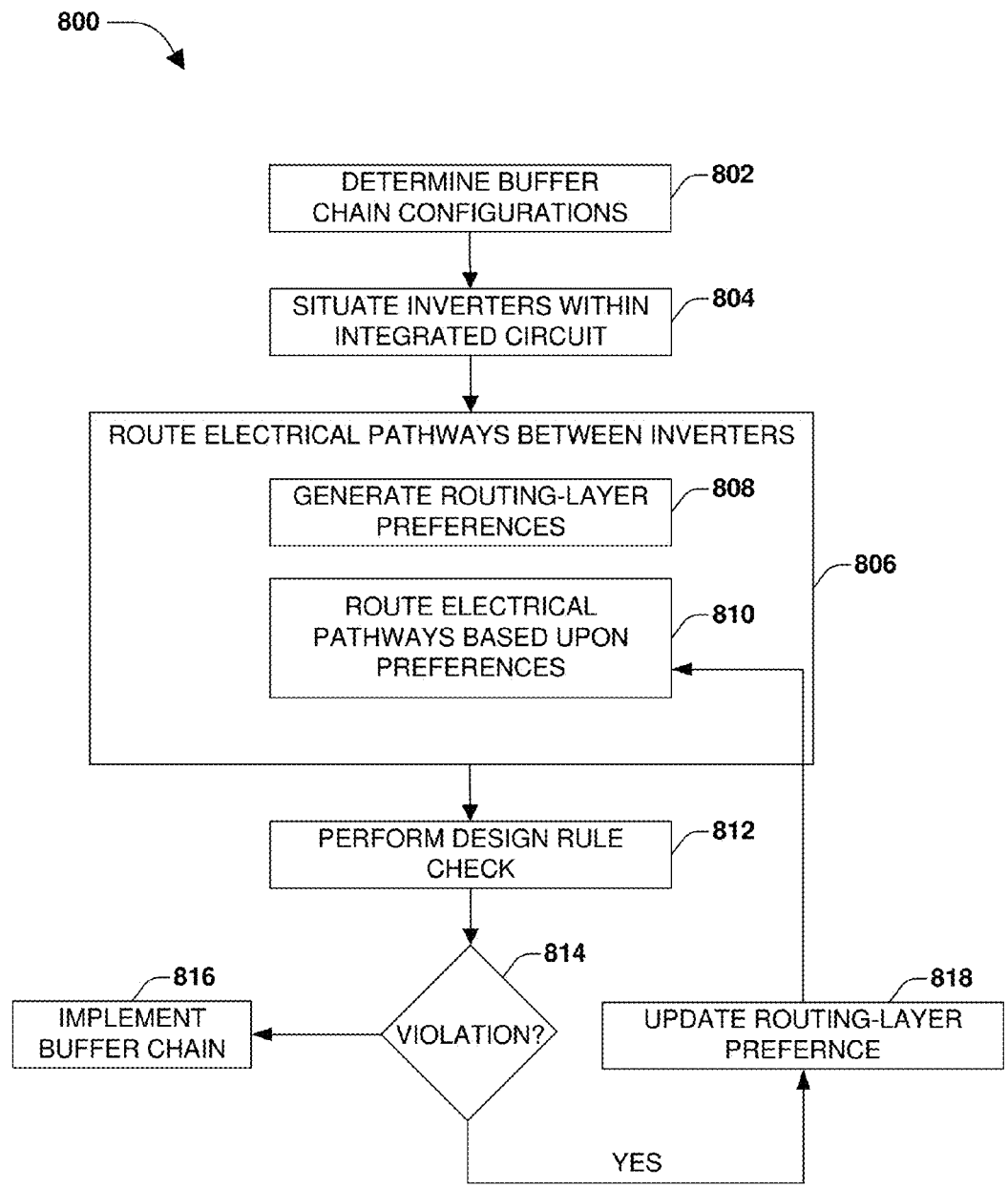
FIG. 8 illustrates a flow diagram of a method for routing electrical pathways between inverters of a buffer chain comprised within an integrated circuit according to some embodiments.

Referring to FIG. 8, an example method 800 for routing electrical pathways between inverters of a buffer chain comprised within an integrated circuit is provided. At 802 in the example method 800, a buffer chain configuration for the integrated circuit is determined. In some embodiments, determining a buffer chain configuration comprises determining a number of inverters to be included within a buffer chain coupling a first cell to a second cell, such as a first memory cell to a second memory cell. The number of inverters is a function of, among other things, a desired drive capability of the buffer chain or a desired amount of delay that the buffer chain is to introduce into signals transmitted between the first cell and the second cell, for example.

In some embodiments, the buffer chain configuration specifies the location of respective inverters within the integrated circuit. For example, a design rule provides that inverters are to be no less than 5 nm from a memory cell. Accordingly, determining the buffer chain configuration at 802 comprises determining a layout for the inverters based upon the restriction imposed by the design rule.

At 804 in the example method 800, the inverters are situated within an integrated circuit based upon the buffer chain configuration, and electrical pathways between respective inverters are routed at 806. Routing the electrical pathways at 806 comprises generating one or more routing-layer preferences at 808 and routing the electrical pathways based upon the routing-layer preferences at 810. By way of example, a number of metal layers within a routing substrate, a desired distance between electrical pathways, or the layout of respective cells within the integrated circuit is received. Based upon this information, one or more routing-layer preferences are generated. The routing-layer preferences specify the number of connection points, or apexes, per metal layer or the distance between apexes, for example. As another example, routing-layer preferences include a permissible degree of overlap between electrical pathways. For example, the routing-layer preferences specify that there must be at least one metal layer separating overlapping electrical pathways.

In some embodiments, routing electrical pathways based upon the routing-layer preferences comprises determining an electrical pathway between a first inverter of the buffer chain and a second inverter of the buffer chain. The electrical pathway is formed by a first conductive path extending through a first set of metal layers and a second conductive path extending through the first set, which are coupled together at a top metal layer of the first set. In some embodiments, routing electrical pathways based upon the routing-layer preferences comprises determining a second electrical pathway between the second inverter and a third inverter of the buffer chain. The second electrical pathway is formed by a third conductive path extending through a second set of metal layers and a fourth conductive path extending through the second set, which are coupled together at a top metal layer of the second set. In some embodiments, the top layer of the second set is different than the top layer of the first set.

At 812, a design rule check is performed to verify that the layout of the buffer chain, including the inverters and the electrical pathways, do not violate one or more designs rules. By way of example, the design rule check verifies that timing criteria, for transferring a signal through the buffer chain, is satisfied. As another example, the design rule check verifies that the routing pattern of one or more electrical pathways does not violate a design rule.

At 814, a decision is made about whether the layout of the buffer chain violates the one or more design rules. If no violation is identified, the buffer chain is implemented in an integrated circuit at 816, wherein a first terminal of the buffer chain is linked to a first cell of the integrated circuit and a second terminal of the buffer chain is linked to a second cell of the integrated circuit. If a violation is identified, one or more of the routing-layer preferences are updated in view of the violation at 818 and the electrical pathways are re-routed at 810 based upon the updated routing-layer preferences.

In some embodiments, at least a portion of the process is repeated until a stopping criterion is satisfied. For example, the routing 810, the performing 812, the deciding 814, and the updating 818 are repeated until it is determined that the layout of the buffer chain does not violate the one or more design rules.

Figure 9:
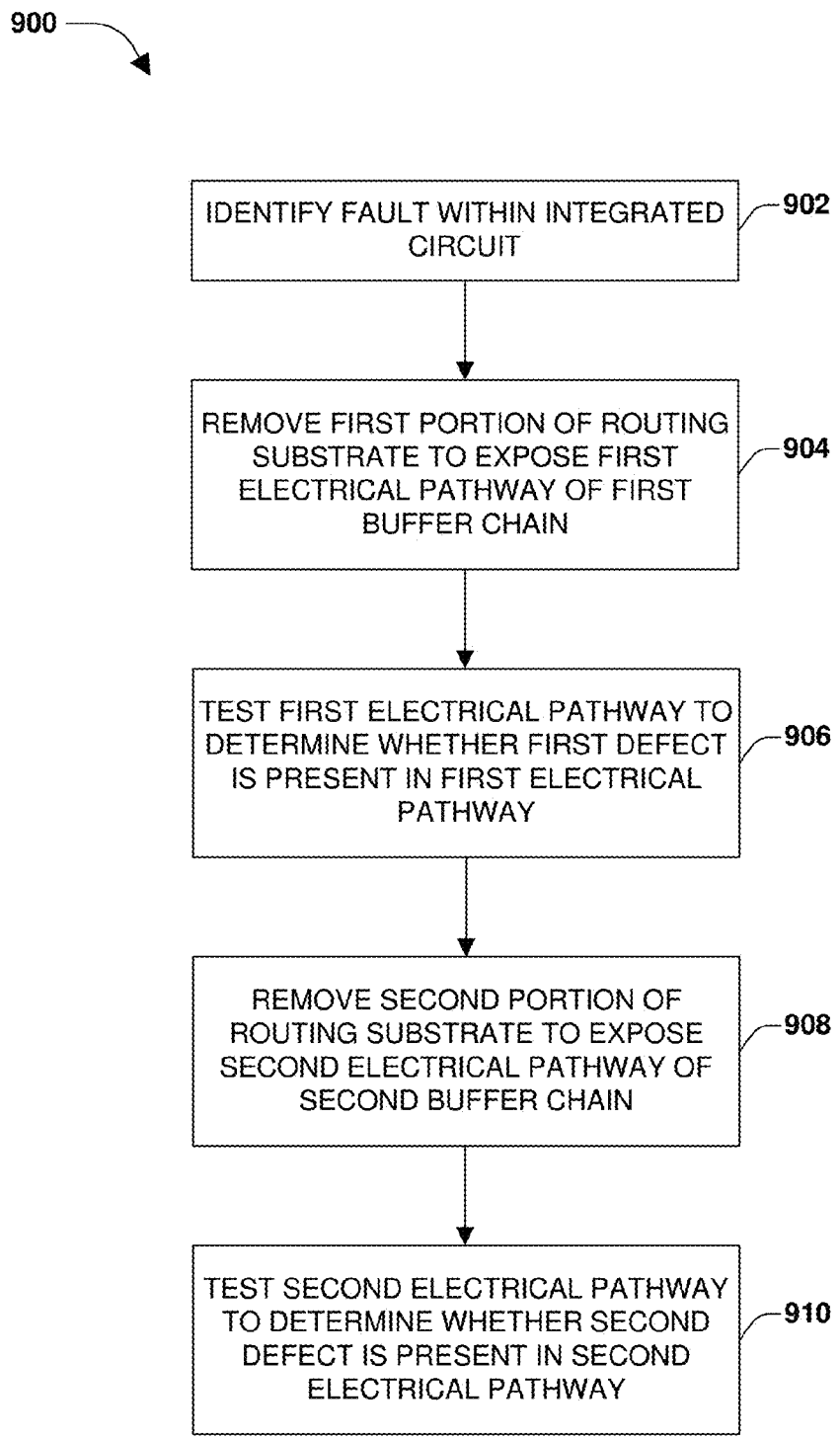
FIG. 9 illustrates a flow diagram of a method for defect detection according to some embodiments.

Referring to FIG. 9, an example method 900 is provided. In some embodiments, the example method 900 is utilized to determine a location of a defect within an integrated circuit. At 902 in the example method 900, a fault is identified within an integrated circuit. By way of example, a series of one or more manufacturing tests are performed on the integrated circuit to determine if the integrated circuit performs as desired. Based upon results of these tests, it is determined whether the integrated circuit has a fault, for example.

If a fault is identified, a location of a defect or defects within the integrated circuit that contribute to the fault is determined. For example, at 904 in the example method 900, a first portion of a routing substrate is removed to expose a first electrical pathway of a first buffer chain. For example, a top insulator layer is removed to expose an apex of the first electrical pathway that is formed within a first metal layer of the routing substrate, and at 906 the first electrical pathway is tested to determine whether a first defect is present in the first electrical pathway. By way of example, electrons are applied to the first electrical pathway and an electron beam prober measures the voltage or current through the first electrical pathway to generate an image in which defects in the first electrical pathway are identifiable.

In some embodiments, a similar process is repeated for respective portions of the routing substrate until a defect is identified or until other stopping criterion is satisfied. For example, at 908, a second portion of the routing substrate is removed to expose a second electrical pathway of a second buffer chain, and at 910, the second electrical pathway is tested to determine whether a second defect is present in the second electrical pathway. In some embodiments, the second buffer chain and the first buffer chain are a same buffer chain. In some embodiments, the second buffer chain is different than the first buffer chain.

Figure 10:
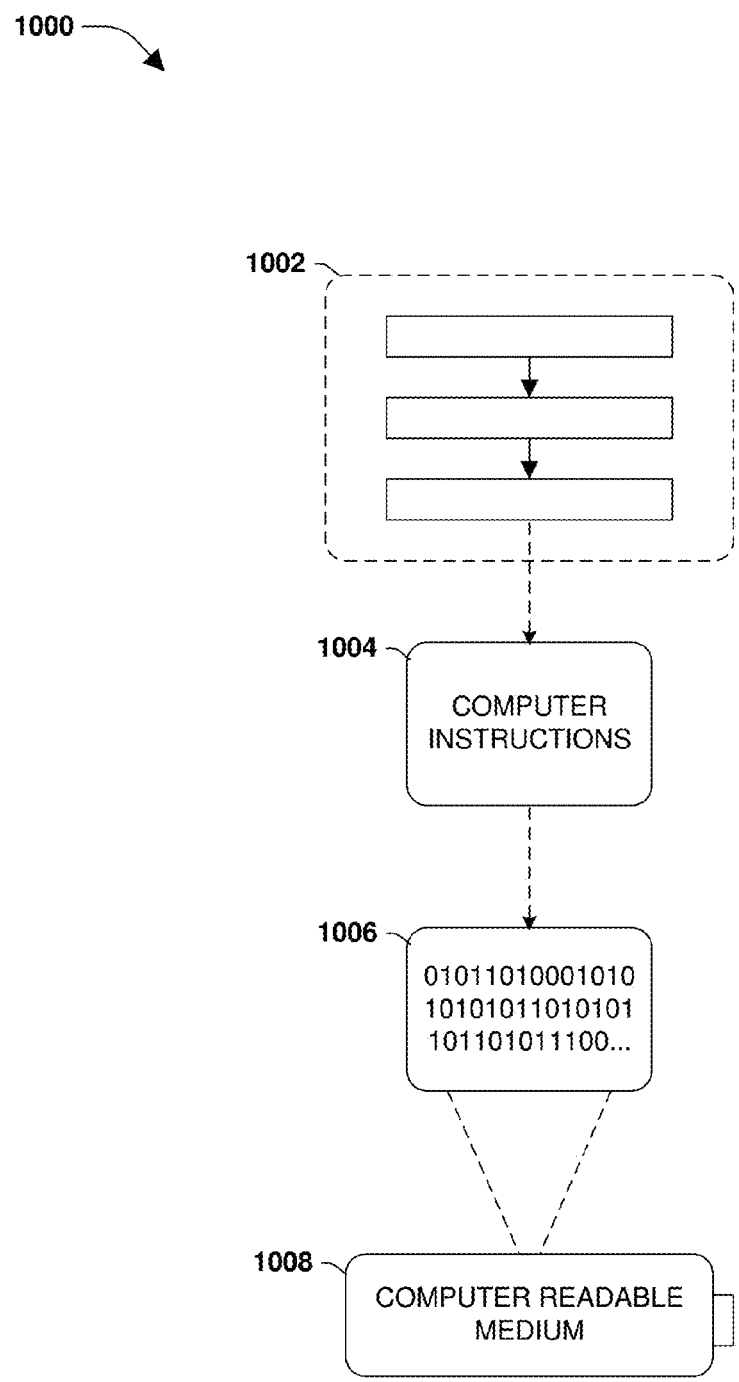
FIG. 10 is a diagram illustrating an example computer-readable medium, comprising processor-executable instructions configured to embody one or more of the provisions set forth herein according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 10, wherein an implementation 1000 comprises a computer-readable medium 1008, such as a CD-R, DVD-R, flash drive, a platter of a hard disk drive, etc., on which is encoded computer-readable data 1006. This computer-readable data 1006, such as binary data comprising a plurality of zero's and one's as shown in 1006, in turn comprises a set of processor-executable instructions 1004 which when executed via one or more processing units are configured to operate according to one or more of the principles set forth herein. In some embodiments 1000, the processor-executable instructions 1004 are configured to perform an operation 1002, such as at least some of the method 800 of FIG. 8 or at least some of the method 900 of FIG. 9. In other embodiments, the processor-executable instructions 1004 are configured to implement a system such as at least some of the integrated circuit 100 of FIG. 1. Many such computer-readable media are devised by those of ordinary skill in the art that are configured to operate in accordance with the techniques presented herein.

According to an aspect of the instant disclosure, an integrated circuit is provided. The integrated circuit comprises a buffer chain comprising a first conductive path extending through a first set of metal layers of a routing substrate a second conductive path extending through the first set. The first conductive path is coupled to a first inverter of the buffer chain and the second conductive path is coupled to a second inverter of the buffer chain. The first conductive path is coupled to the second conductive path at a top metal layer of the first set to form an electrical pathway between the first inverter and the second inverter.

According to another aspect of the instant disclosure, a method is provided. The method comprises identifying a fault within an integrated circuit and removing a first portion of a routing substrate to expose a first electrical pathway of a first buffer chain of the integrated circuit to determine whether a first defect is present in the first electrical pathway responsive to the identifying. The method also comprises removing a second portion of the routing substrate to expose a second electrical pathway of a second buffer chain of the integrated circuit to determine whether a second fault is present in the second electrical pathway responsive to the identifying.

According to yet another aspect of the instant disclosure, an integrated circuit is provided. The integrated circuit comprises a buffer chain comprising a first electrical pathway extending through a first set of metal layers of a routing substrate and coupling a first inverter to a second inverter and a second electrical pathway extending through a second set of metal layers of a routing substrate and coupling a third inverter to a fourth inverter. The first set of metal layers is different than the second set of metal layers.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   identifying a fault within an integrated circuit;
   removing a first portion of a routing substrate to expose a first electrical pathway of a first buffer chain of the integrated circuit to determine whether a first defect is present in the first electrical pathway responsive to the identifying; and
   removing a second portion of the routing substrate to expose a second electrical pathway of a second buffer chain of the integrated circuit to determine whether a second fault is present in the second electrical pathway responsive to the identifying.

2. The method of claim 1, the first buffer chain different than the second buffer chain.

3. The method of claim 1, the removing a first portion, comprising:
   exposing a first metal layer at which an apex of the first electrical pathway is formed to expose the first electrical pathway.

4. The method of claim 3, the removing a second portion, comprising:
   exposing a second metal layer at which an apex of the second electrical pathway is formed to expose the second electrical pathway, the second metal layer below the first metal layer.

5. The method of claim 1, comprising:
   testing the first electrical pathway to determine whether the first defect is present prior to the removing a second portion.

6. The method of claim 5, the testing comprising:
   testing the first electrical pathway via an electron beam prober.

7. The method of claim 1, the removing a second portion comprising:
   removing a portion of the first electrical pathway.

8. A method, comprising:
   identifying a fault within an integrated circuit;
   removing a first layer of a routing substrate to expose a first electrical pathway of the integrated circuit;
   testing the first electrical pathway to determine whether the fault is within the first electrical pathway;
   if the fault is not within the first electrical pathway:
      removing a second layer of the routing substrate to expose a second electrical pathway of the integrated circuit; and
      testing the second electrical pathway to determine whether the fault is within the second electrical pathway.

9. The method of claim 8, the removing a first layer comprising:
   exposing an apex of the first electrical pathway.

10. The method of claim 9, the removing a second layer comprising:
    exposing an apex of the second electrical pathway.

11. The method of claim 8, the second layer below the first layer.

12. The method of claim 8, the testing the first electrical pathway comprising:
    testing the first electrical pathway via an electron beam prober.

13. The method of claim 8, the removing a second layer comprising:
    removing a portion of the first electrical pathway comprised within the second layer.

14. The method of claim 8, the removing a first layer comprising:
    exposing the second layer.

15. A method, comprising:
    routing a first electrical pathway for coupling a first buffer of an integrated circuit to a second buffer of the integrated circuit through a first set of layers of a routing substrate; and
    routing a second electrical pathway for coupling the second buffer to a third buffer of the integrated circuit through a second set of layers of the routing substrate, wherein an apex of the first electrical pathway is disposed in a first layer of the routing substrate and an apex of the second electrical pathway is disposed in a second layer of the routing substrate, the second layer different than the first layer.

16. The method of claim 15, the first set of layers and the second set of layers having at least one layer in common.

17. The method of claim 15, at least one of the first buffer, the second buffer, or the third buffer comprising an inverter.

18. The method of claim 15, comprising:
    identifying a fault within the integrated circuit;

exposing the first layer of the routing substrate;
testing the first electrical pathway while the first layer is exposed to determine whether the fault is within the first electrical pathway;
if the fault is not within the first electrical pathway:
 exposing the second layer of the routing substrate; and
 testing the second electrical pathway to determine whether the fault is within the second electrical pathway.

19. The method of claim 15, comprising:
performing a design rule check after the routing a first electrical pathway and the routing a second electrical pathway.

20. The method of claim 19, comprising:
re-routing the first electrical pathway through a third set of layers of the routing substrate responsive to identifying a design rule violation based upon the design rule check, the third set of layers different than the first set of layers and the second set of layers.

* * * * *